United States Patent
Digele

(10) Patent No.: US 6,191,645 B1
(45) Date of Patent: Feb. 20, 2001

(54) ELECTRONIC CIRCUIT WITH PARTITIONED POWER TRANSISTOR

(75) Inventor: Georg Digele, Tuebingen (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/293,227

(22) Filed: Apr. 16, 1999

(30) Foreign Application Priority Data

Apr. 16, 1998 (DE) .............................................. 198 16 806

(51) Int. Cl.[7] .................................................. G05F 1/10
(52) U.S. Cl. .......................................... 327/543; 327/538
(58) Field of Search .................................. 327/538, 540, 327/541, 543; 323/312

(56) References Cited

U.S. PATENT DOCUMENTS

| 4,675,594 | * | 6/1987 | Reinke | 327/541 |
| 4,683,382 | * | 7/1987 | Sakurai et al. | 327/541 |
| 5,254,883 | * | 10/1993 | Horowitz et al. | 327/541 |
| 5,493,234 | * | 2/1996 | Oh | 327/541 |
| 5,506,541 | * | 4/1996 | Herndon | 327/541 |
| 5,999,041 | * | 12/1999 | Nagata et al. | 327/538 |

* cited by examiner

*Primary Examiner*—Terry D. Cunningham
(74) *Attorney, Agent, or Firm*—Kenyon & Kenyon

(57) ABSTRACT

An electronic circuit having an actuator, which is used for controlling high currents. The actuator includes multiple partial actuators, each of which is regulated according to temperature. The partitioned temperature-dependent regulation of the partial actuators used to homogenize the thermal load on the actuator.

7 Claims, 7 Drawing Sheets

ELECTRONIC CIRCUIT WITH PARTITIONED POWER TRANSISTOR

BACKGROUND INFORMATION

The present invention relates to an electronic circuit. Electronic circuits with power devices, for example VDMOS (Vertical Double Diffuse Metal Oxide Semiconductor) transistors composed of multiple parallel-connected cells, are already known. Aside from parasitic effects caused by plating, these cells are controlled by the same electrical potential. This produces a power loss more or less homogeneously across the surface of the power device, producing a hot spot, i.e., a point having the maximum temperature, on the surface of the power device.

SUMMARY OF THE INVENTION

The circuit according to the present invention has the advantage over the related art that it spreads the region of maximum temperature across a wider area on the surface of power devices, for example, thus also reducing the temperature at the point of maximum temperature. A further advantage is the fact that homogenization of the temperature distribution increases device reliability and service life and reduces the necessary chip area due to the ability to use smaller power loss producers, i.e., smaller power devices; this, in turn, reduces the unit cost of the IC.

It is especially advantageous to provide a separate temperature sensor for each partial actuator or for each cell of the power device. This makes it possible to regulate the temperature, over time, to give a uniform operating temperature in places that can be freely selected by the placement of the temperature sensors, provided that the overall device power loss available for regulation is physically sufficient and the sensor can be clearly situated in a location that is directly next to the partition or cell to be regulated. It is possible to generate certain isothermal fronts for placing temperature-sensitive circuit groups directly next to the power device. In addition, the distribution of the overall power loss predetermined by the circuit to the individual partitions can be controlled so that corresponding operating temperatures are produced at predetermined points in the layout of the circuit containing the actuator or the power device. The spatial variation of the isotherms can be independent of time providing a greater selection of possible layouts. Previously, locating temperature-sensitive circuit groups in the vicinity of power devices required placing these circuit groups equidistant from the power loss producers and as far apart from them as possible. The isothermal fronts can be preferably provided parallel to the chip edges, additionally simplifying the layout.

Symmetrical circuit groups, e.g., current mirrors, are used to neutralize production tolerances in electronic circuits. If circuit groups of this type are positioned in the vicinity of large power loss producers, such as power transistors, it is important to make sure that the components of these circuit groups are operated at the same operating temperature, since the electrical characteristics of semiconductor devices are known to be greatly dependent on temperature (with 1 to 2 millivolts per Kelvin, the forward voltage of a diode is dependent on temperature). Especially in the case of symmetrical circuit groups, such as current mirrors, the provision of multiple temperature sensors in the electronic circuit according to the present invention is therefore advantageous. These symmetrical devices should, if possible, be placed on an isotherm, i.e., a line of equal temperature. In addition to the current flowing through the partial actuators of the actuator, the isotherms are dependent on the geometry (i.e., the layout, of the power loss producers integrated on the chip, for example the power transistor functioning as an actuator) as well as on the operating state of the circuit (i.e., the variation, over time, of the power loss produced.) The circuit containing the temperature sensors allows for transient correspondence between the sensor temperatures, i.e., correspondence between the sensor temperatures at any time during circuit operation.

DETAILED DESCRIPTION

Figure 1:
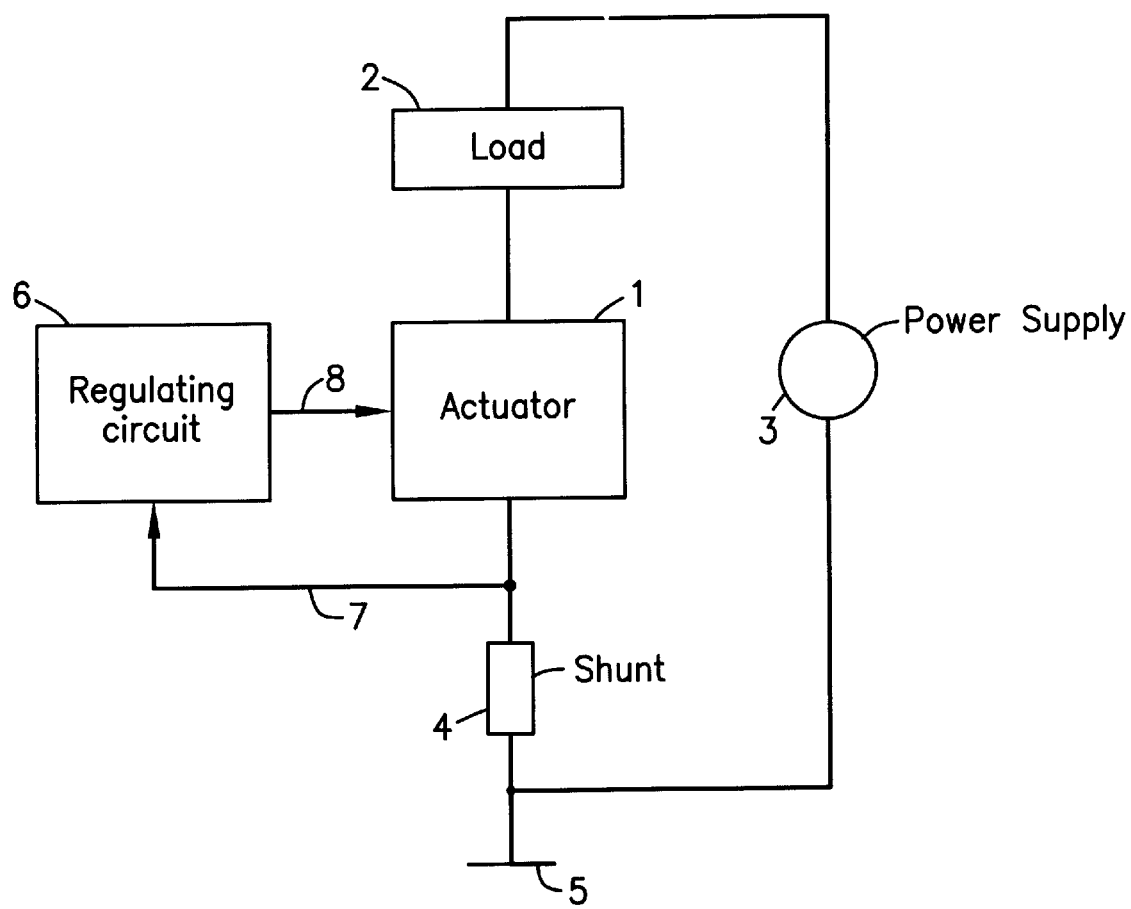
FIG. 1 is a block diagram of an electronic circuit with an actuator according to one embodiment of the present invention.

FIG. 1 is a block diagram of an electronic circuit with an actuator 1, for example a transistor, that is connected in series to load 2. Actuator 1 is additionally connected in series to shunt 4, which, in turn, is connected to ground 5. Time-dependent power supply 3 is connected to load 2, as well as to ground 5. A voltage tap 7 between actuator 1 and shunt 4 is connected to regulating circuit 6, which is connected to actuator 1 via regulating path 8.

The current flowing through load 2 is transformed into a voltage by shunt 4. Regulating circuit 6 regulates actuator 1 so that the voltage at voltage tap 7, and thus the load current, takes on a predetermined value. Load 2 is not integrated on the chip. The main power loss producer on the chip, on which regulating circuit 6, shunt 4, and actuator 1 are also integrated, is the actuator. High currents flowing through load 2 thus require a large actuator which can switch the load current without much loss.

Figure 2:
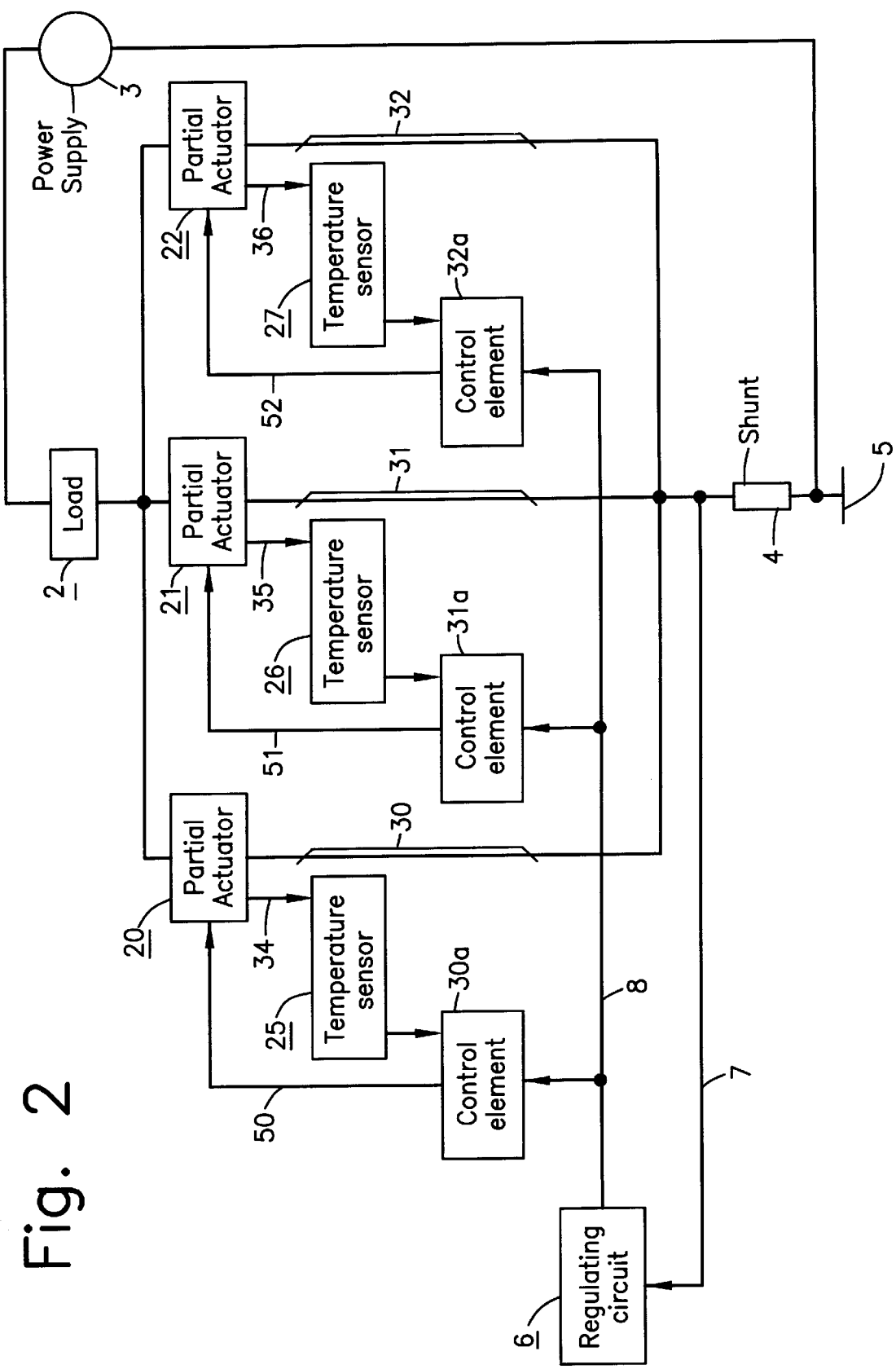
FIG. 2 is a block diagram of a circuit with an actuator having multiple partial actuators according to one embodiment of the present invention.

FIG. 2 is a block diagram of an electronic circuit with an actuator that has a first partial actuator 20, a second partial actuator 21, and a further partial actuator 22. These partial actuators are connected in parallel and also connected to shunt 4, power supply 3, and load 2, analogous to the block diagram of FIG. 1. Regulating circuit 6 is electrically connected to temperature-dependent control elements 30, 31, 32 via regulating path 8, with first temperature-dependent control element 30 being connected to first partial actuator 20 via first regulating path segment 50, second temperature-dependent control element 31 being connected to second partial actuator 21 via second regulating path segment 51, and further temperature-dependent control element 32 being connected to further partial actuator 22 via further regulating path segment 52. The temperature-dependent control elements 30, 31 and 32 each have a temperature sensor 25, 26, and 27 which is connected to the corresponding partial actuator via thermal link 34, 35, and 36, and they also each have control elements 30a, 31a and 32a.

Actuator 1 shown in FIG. 1, a power device responsible for producing a parasitic power loss, is partitioned in FIG. 2 into multiple small power loss producers (partial actuators 20, 21 and 22), which, combined, have the same electrical performance as single actuator 1 in FIG. 1. This is accomplished with a triple electrical parallel connection (generally in multiples of n) of the three (n) smaller partitions. Depending on their operating temperatures, measured by temperature sensors placed next to or on the surface of the individual partial actuators, individual partial actuators 20, 21, 22 are regulated so that the temperatures of all sensors correspond at all times. Because the total current flowing through regulating circuit 6 is adjusted to a desired setpoint, the temperature-dependent regulation action of the partial actuators distributes the overall power loss to the individual partial actuators via regulating path segments 50, 51, and 52 using temperature-dependent control elements 30, 31, and 32, so that the partition with the least efficient heat dissipation is assigned the smallest current component, while the partition with the most efficient heat dissipation receives the most current. Unlike in conventional systems, the point is not to regulate the temperature to an absolute value, instead, the goal of regulation is for the sensor temperatures to correspond transiently, i.e., for them to correspond at any time during actuator operation.

Figure 3:
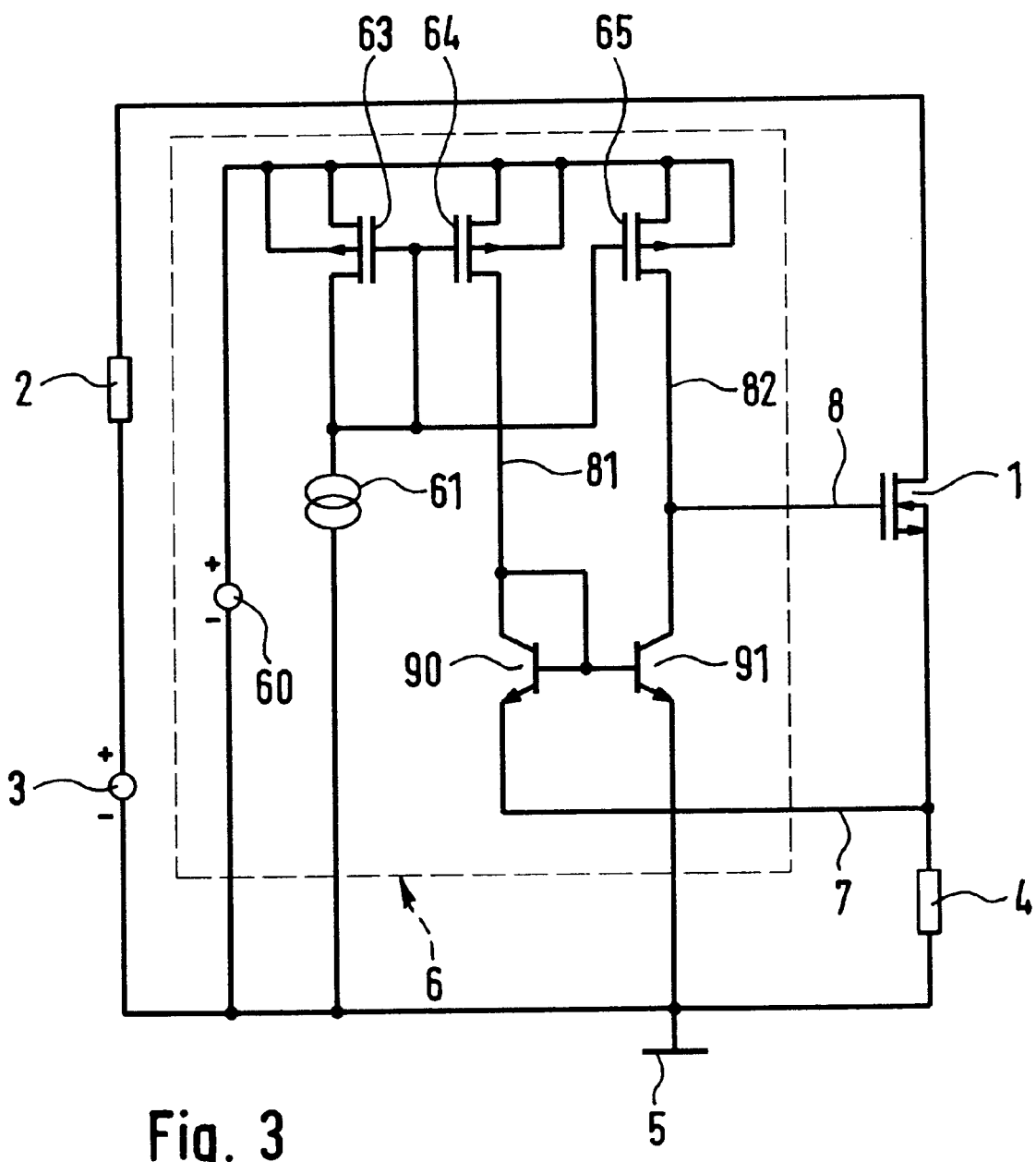
FIG. 3 is a schematic of an electronic circuit employing a VDMOS transistor with 1,536 cells as the actuator according to one embodiment of the present invention.

FIG. 3 is a schematic of a circuit having the layout illustrated in FIG. 1, in which actuator 1 is formed by an n-channel VDMOS power transistor with 1,536 cells. Regulating circuit 6 is formed by p-channel MOSFET transistors 63, 64, 65, a voltage source 60, a reference current source 61, and two bipolar transistors 90 and 91. The sources and backgates of transistors 63, 64, and 65 are connected to the positive terminal of voltage source 60. The negative terminal of voltage source 60 is connected to ground 5. The drain of transistor 63 is connected to reference current source 61, whose second pole, in turn, is connected to grounds 5. The gates of transistors 63 and 64 are connected to each other and to the drain of transistor 63. The gate of transistor 65 is also connected to the drain of transistor 63. The drains of transistors 64 and 65 are connected to the collector of n-p-n bipolar transistor 90 and 91 respectively. The connection between the drain of transistor 64 and the collector of bipolar transistor 90 is referred to as output current path 81, and the corresponding connection between transistor 65 and transistor 91 as output current path 82. The connection between the collector of transistor 91 and the gate of power transistor 1 forms regulating path 8. The connection between the emitter of transistor 90 and shunt 4 forms voltage tap 7. The base and collector of transistor 90 are shorted together and the base of transistor 91 is also connected to the base of transistor 90. The emitter of transistor 91 is connected to ground 5.

Analogous to the block diagram of FIG. 1 the current flowing through load 2 is measured by the voltage drop at shunt 4. If the current is to be adjusted to 1 ampere by the load, the product of the load current and voltage drop at power transistor 1 yields a power loss of around 9 watts for actuator 1 after the circuit settling time. A 10-volt drain voltage of power supply 3, a 1-ohm load impedance, and a shunt 4 measuring 42 milliohms are given. In the steady-state condition, the product of the load current and measuring impedance is approximately equal to the product of thermal electromotive force kT (divided by e) with the natural logarithm of ratio n for the emitter values between bipolar transistors 90 and 91 (n=5 in the embodiment illustrated). Assuming that the load current increases above one ampere, the base potential of transistor 90, which operates as the current presetting device in a current mirror, increases and thus activates transistor 91. This causes the collector potential of transistor 91 to drop and thus the potential of regulating path 8 as well, which again produces a decrease in the current flowing through power transistor 1.

Figure 4:
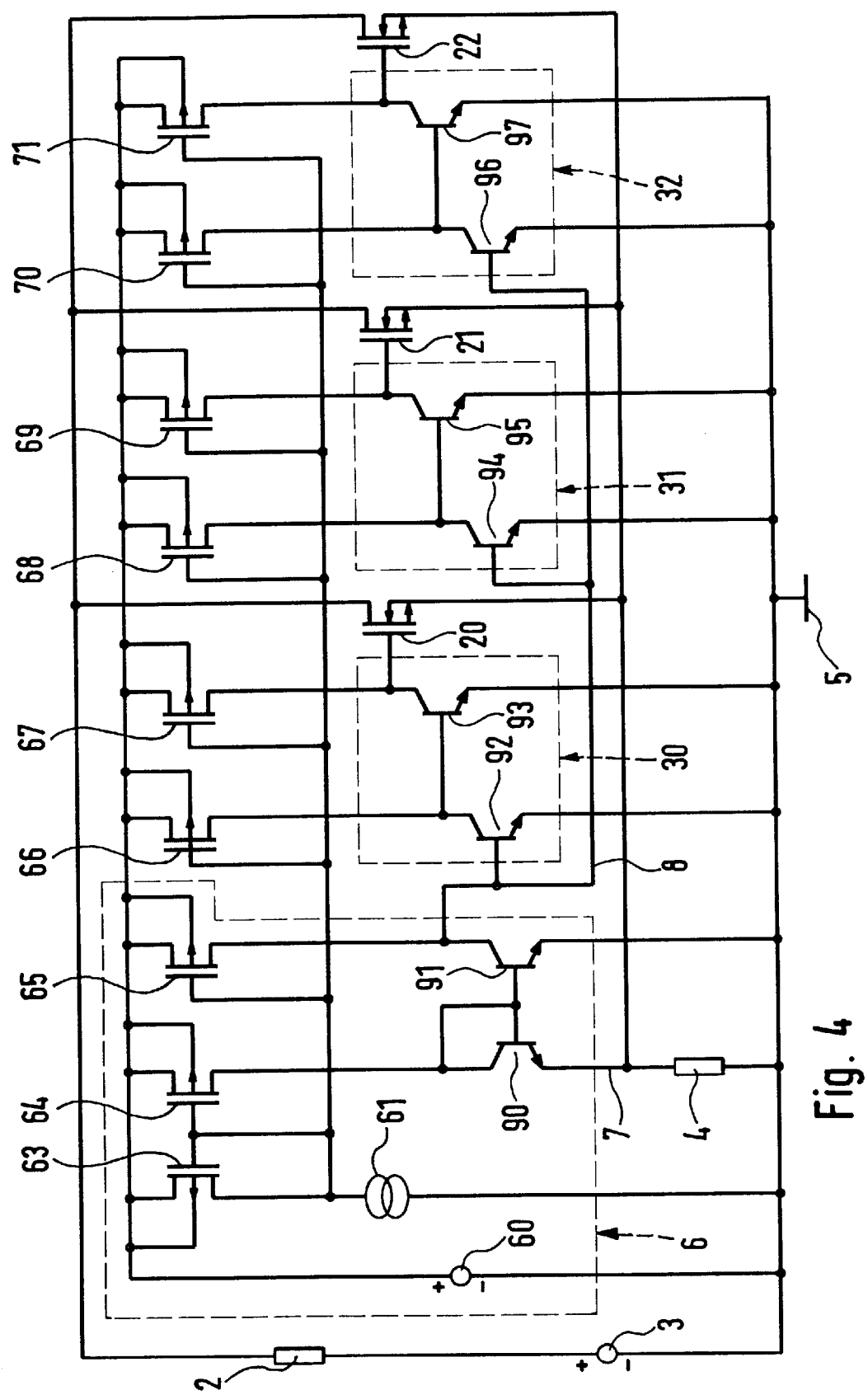
FIG. 4 is a schematic of an electronic circuit with an actuator that has three partial actuators designed in the form of VDMOS transistors, each with 512 cells according to one embodiment of the present invention.

FIG. 4 is a schematic of an electronic circuit having an actuator that is composed of three partitions, i.e., three partial actuators 20, 21, and 22, with each partial actuator being formed by a VDMOS transistor with 512 cells. The same circuit components as in the circuit shown in FIG. 3 are identified by the same reference numbers and are not described again here. A two-stage, bipolar common emitter 92, 93 and 94, 95 and 96, 97 is positioned between the gate of each partial transistor 20, 21, and 22, and regulating path 8. The base of transistor 92 is electrically connected to regulating path 8 and the emitter of transistor 92 is connected to ground. The base of transistor 93 is connected to the collector of transistor 92, the emitter of transistor 93 is connected to ground 5 and the collector of transistor 93 is connected to the gate of partial transistor 20. The collectors of transistors 92 and 93 are electrically connected to the drains of transistors 66 and 67 respectively. The remaining connections of transistors 66 and 67 are wired in the same manner as transistors 64 and 65. Designed as a two-stage bipolar common emitter, transistors 92 and 93 form first temperature-dependent control element 30. Likewise, transistors 94 and 95 form second temperature-dependent control element 31, and transistors 96 and 97 form a further temperature-dependent control element 32. Transistors 68 and 69 and transistors 70 and 71 are wired in the same manner as transistors 66 and 67, and assigned to corresponding temperature-dependent control elements 31 and 32.

The overall power loss of the actuator is distributed to the individual parallel-connected partial actuators by a second regulating circuit within the branches assigned to the individual partitions, i.e., by temperature-dependent control elements 30, 31, and 32. Although this has no effect on the overall power loss and circuit operation, it may be necessary to reset the working point of the first regulating circuit once, due to the insertion of the second regulating circuit. The second regulating circuit ideally represents a temperature-dependent voltage source that is connected upstream from the gate of the corresponding partial transistor. Because the partial transistor must return the current when the temperature of a corresponding partition rises,an upstream regulating circuit must be provided which reduces the corresponding gate potential of the corresponding n-channel VDMOS partial transistor as the temperature rises, thereby compensating for the rise in temperature with a smaller power loss. Temperature sensor 25 of first temperature-dependent control element 30 (see FIG. 2) is formed by bipolar transistor 93, whose forward voltage is dependent on temperature and whose base-emitter link is thermally coupled with partial transistor 20. The same applies to control elements 31 and 32 as well as to correspondingly assigned temperature respectively sensors 26 and 27 (see FIG. 2), which are formed by transistors 95 and 97 respectively. Transistors 93, 95, and 97 are placed as close as possible to corresponding partial transistors 20, 21, and 22 to be regulated. When the temperature of partial transistor 22 increases, for example, bipolar transistor 97 responds by reducing the base-emitter forward voltage. At a given base potential, the transistor opens as the temperature increases, i.e., the collector current increases. The current is predetermined by the current mirror, which includes transistors 63 and 71, with the consequence that the collector potential of transistor 97, and thus the gate potential of partial transistor 22, decreases. Partial transistor 22 subsequently conducts less current, thus generating a smaller power loss, which counteracts the increase in temperature.

The total current, and thus the overall power loss, is regulated by regulating circuit 6; temperature-dependent control elements 30, 31, and 32 distribute the power loss only proportionately so that the very same temperature is ideally present at any point in time at the locations where the sensors, i.e., the base-emitter links of transistors 93, 95, and 97, are placed. If the current in one of the current path segments decreases, regulating circuit 6 registers this through a temporary voltage drop at shunt 4 and regulates the total current by reactivating control elements 30, 31, and 32 via regulating path 8.

Figure 5:
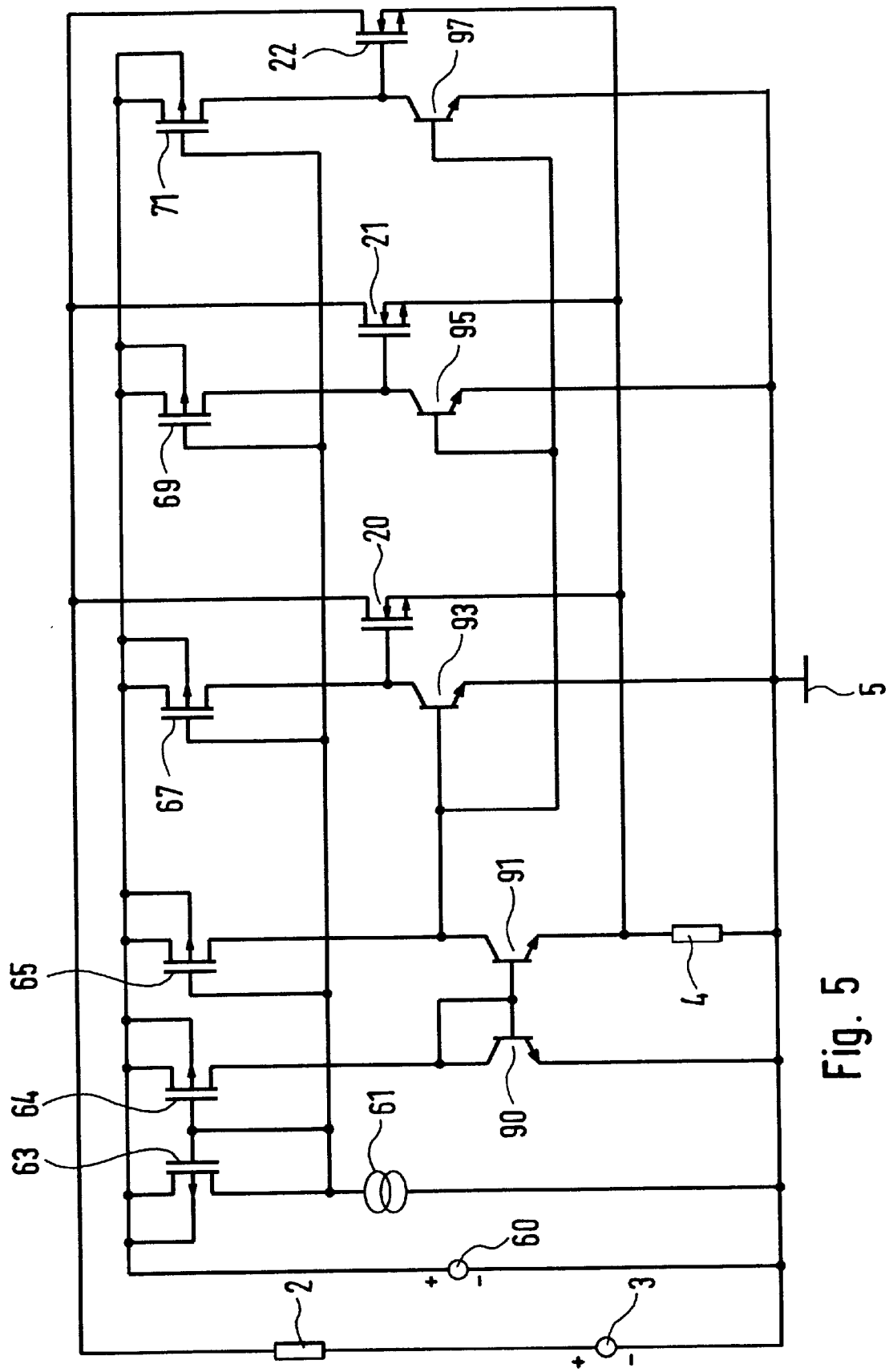
FIG. 5 is a schematic of an electronic circuit with single-stage common emitters positioned upstream from the partial actuators according to one embodiment of the present invention.

FIG. 5 is a schematic of an electronic circuit containing partial actuators 20, 21, and 22, with temperature-dependent control elements 30, 31, and 32 being designed in the form of a single-stage bipolar common emitter containing transistors 93, 95, and 97. The same circuit components as described above are identified by the same reference numbers and are not described again here. Unlike in FIG. 4, shunt 4 in FIG. 5 is connected to the emitter of bipolar transistor 91. The base of bipolar transistor 93 is connected to the collector of bipolar transistor 91, the collector of bipolar transistor 93 is connected to the gate of partial transistor 20, while the emitter of transistor 93 is connected to ground 5. Like bipolar transistor 93, bipolar transistors 95 and 97 are connected to corresponding partial transistors 21 and 22 respectively. Transistors 67, 69, and 71 are also wired as shown in FIG. 4; unlike in FIG. 4, however, transistors 66, 68, and 70 are not provided, since the single-stage layout of the temperature-dependent control elements as shown in FIG. 5 eliminates the need for transistors 92, 94, and 96 shown in FIG. 4.

In the embodiment shown in FIG. 4, the two-stage common emitters make it necessary to provide four additional devices per partial transistor, for example transistors 66, 67, 92, and 93 for partial transistor 20. The additional space requirements associated with this are negligible compared to the space needed for the power device. In a further step, the number of additional devices required can, however, be cut in half by connecting only one single-stage, inverting common emitter upstream from each partial actuator. The negative feedback of the overall circuit control is taken into account by the fact that regulating circuit 6 (see FIG. 1) also has an inverted layout. This inverted layout is effected by moving shunt 4 to be connected to the emitter of bipolar transistor 91, compared to the circuit in FIG. 4, in addition to adjusting the number of emitters of transistors 90 and 91. Regulating circuit 6 (see FIG. 1) now operates more or less in the "wrong" direction, but is balanced out by the inverting common emitters of temperature-dependent control elements 30, 31, and 32, which are formed by transistors 93, 95, and 97 respectively.

Figure 6A:
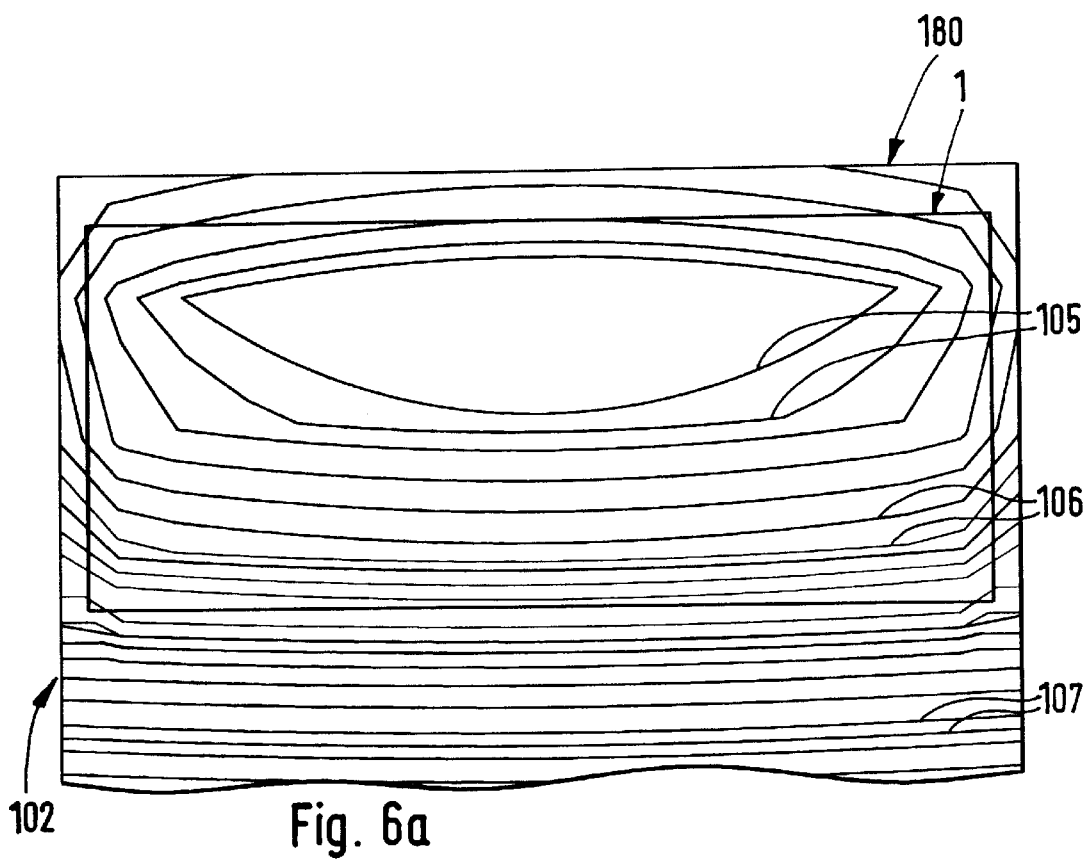
FIG. 6a shows a graph of isothermal fields pertaining to a chip with a power transistor located at the top edge of the chip according to one embodiment of the present invention.

FIG. 6a shows isothermal fields 102, 103 respectively that were created with a simulation computer. These isothermal fields represent the shape of lines of constant temperature on the surface of a chip 180, which has power transistor 1 from FIG. 3 located along the top edge of chip 180 (i.e., in the upper region of FIG. 6a). FIG. 6a shows high-temperature isotherms 105, medium-temperature isotherms 106, and low-temperature isotherms 107. Between these isotherms run additional isotherms, which depict the temperature graduations on the surface of chip 180. Bends and angles in the isotherm shape are caused by the grid of the electrothermal simulator used.

A sharp rise can be seen in temperature in a high-temperature region, resembling "steep mountain peaks." The isotherms along the lower end of the final stage are curved and must be "straightened" by partitioning the power transistor.

Figure 6B:
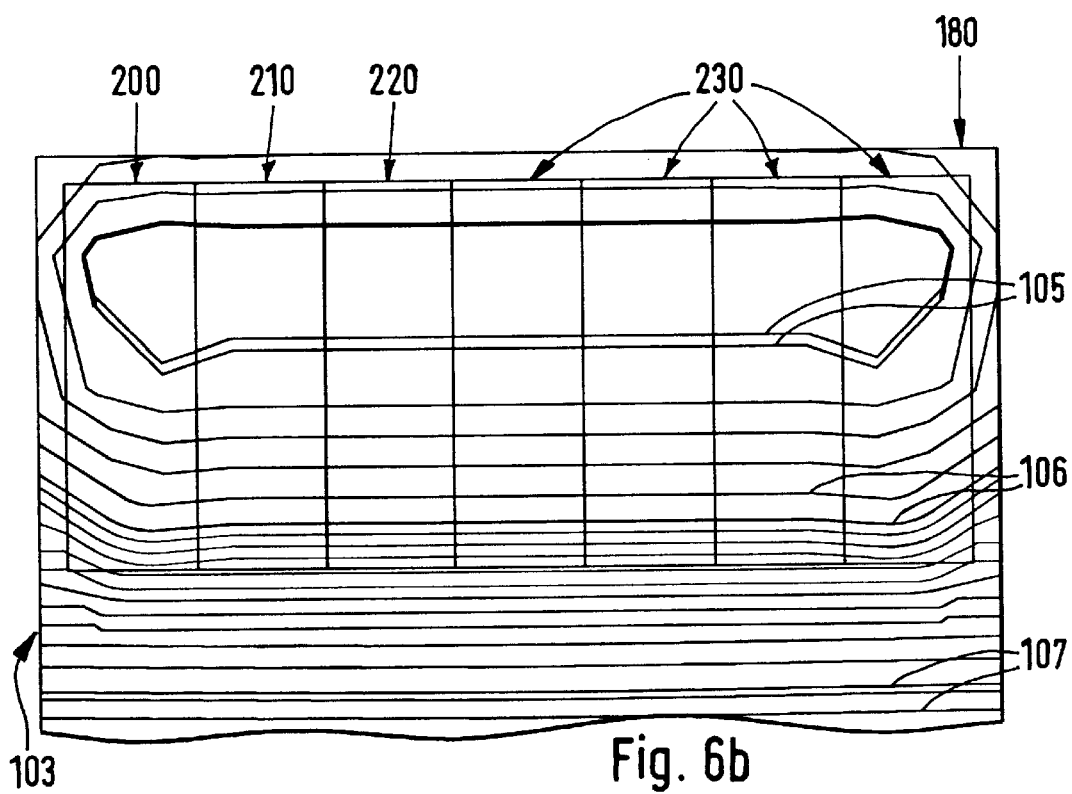
FIG. 6b shows a graph of isothermal fields on the surface of a chip whose upper region includes a partitioned power transistor.

FIG. 6b is a graph of an isotherm field 103 on the surface of a chip, whose upper region contains a partitioned power transistor. In the example shown, transistor 1 is partitioned into areas 200, 210, 220, and 230. First partial actuator 20 (see FIG. 2) is located in first area 200, second partial actuator 21 in second area 210, further partial actuator 22 in further area 220, and four additional partial actuators in areas 230. In these areas, the partitions of the power transistor are located along the upper edge of chip 180. By dividing the transistor into 7 partitions and using an electronic circuit similar to the circuit shown in FIG. 4, whose components are arranged in the lower region of chip 180, isotherms are arranged along the lower edge of the power transistor. The temperature sensors of the temperature-dependent control elements assigned to the individual partitions are also placed along the lower edge of the power transistor. In addition, the isotherm shapes are homogenized, (i.e., the above-mentioned "mountains" flattened out). Thus, the temperature difference between isotherms 105 and 107 in FIG. 6b is less than the difference between isotherms 105 and 107 in FIG. 6a. The more partitions and temperature sensors there are provided, the closer the ideal of a straight isothermal shape parallel to the upper and lower chip edges is achieved.

Figure 7:
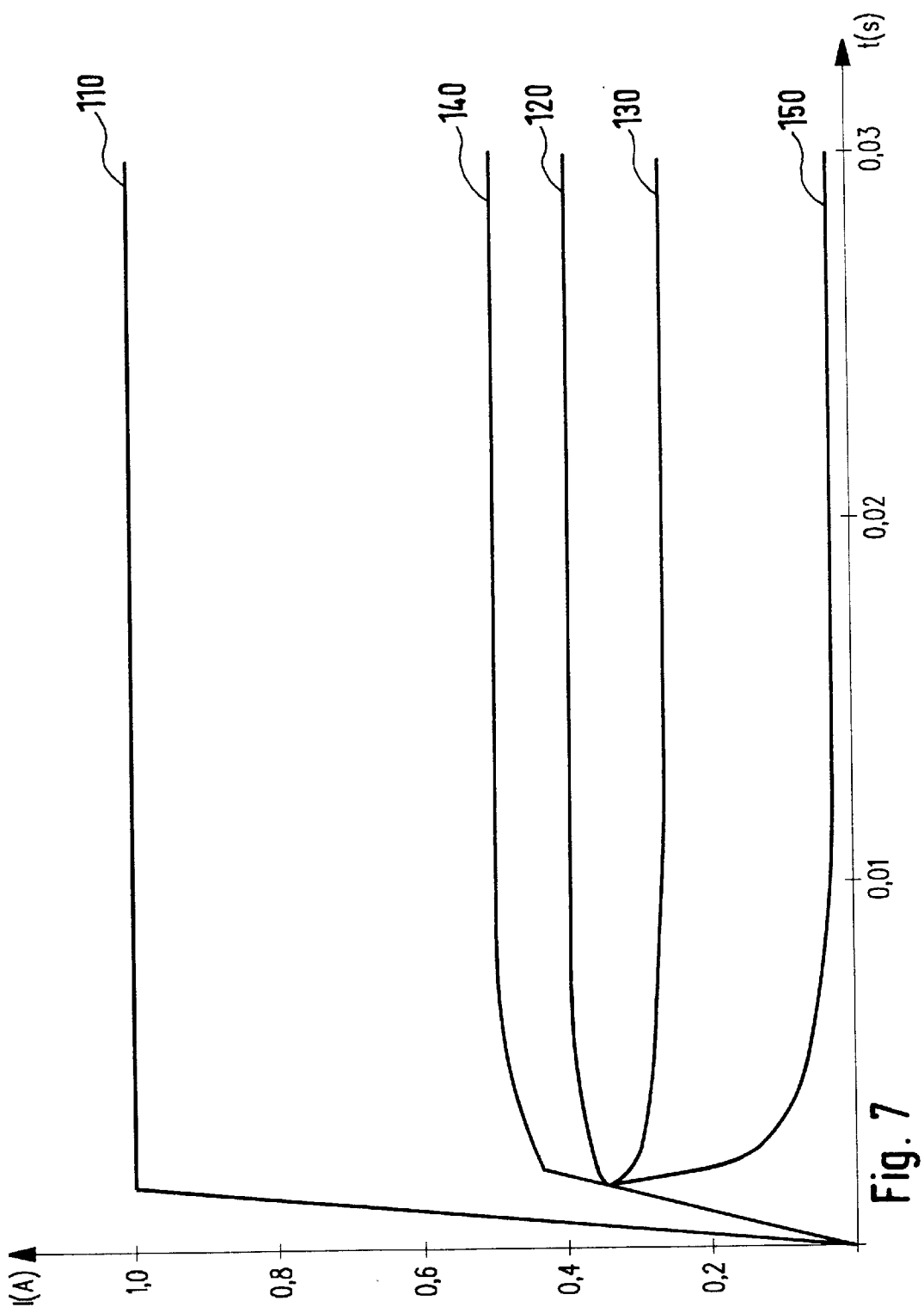
FIG. 7 a graph depicting the time dependence of a total current and of partial currents according to one embodiment of the present invention.

FIG. 7 is a graph depicting the time dependence of different currents. Time variation of the total current 110 is shown, as is the variation over time of the partial currents flowing through partial actuators 20 to 22 (see FIG. 2), represented by curves 140, 120, 130, and 150. A two-stage temperature regulator with three partitions, as shown in FIG. 4, is assumed. If temperature sensors 25 and 27 assigned to control elements 30 and 32 are positioned at the lower left or right edge of partial actuators 20 and 22, the partial currents flowing through partial actuators 20 and 22 yield curve 140, and the current flowing through partial actuator 21 located between partial actuators 20 and 22 yields curve 150. If the sensors are positioned in a central location at the lower edge of the power transistor partitions, the partial currents flowing through partial actuator 20 or 22 yield curve 120 and the current flowing through partial actuator 21 yields curve 130.

The transient variation in the temperature-dependent regulation of the current distribution between the partitions can be seen. According to curve 110, the overall current is set to 0.98 amperes after approximately 2 milliseconds have passed. The 2% ampere deviation is caused by the base current of transistors 92, 94, and 96 and can be corrected by reducing the shunt size. The thermal time constant is much longer than 2 milliseconds.

The current applied to partial actuators 20, 21, and 22 becomes stable only after around 15 milliseconds. For reasons of symmetry, partial actuators 20 and 22 have the same current values. It can be seen that the current assigned to the middle partial actuator declines markedly, thus decreasing the power loss of this partial actuator, while the outer partial actuators record an increase in current. The important thing is that the large thermal time constant is decoupled from the overall current regulation so that it does not influence the overall transient electrical performance. This results in overregulation effects in time curve 110 of the total current, which is common in non-partitioned power transistors, to be reduced by the use of the partitioned temperature regulator. As shown in FIG. 7, arranging the temperature sensors in a central location reduces the difference between partial currents 120 and 130, compared to arranging the sensors along the edge. This achieves a more homogeneous temperature distribution between the sensors than would be the case when arranging only three partitions along the edge. The range of homogeneity can be increased by choosing a higher partition density. A greater decrease in the maximum temperature on the chip by arranging sensors in a central location can be advantageous in temperature-sensitive circuits.

What is claimed:

1. An electronic circuit for use in controlling a flow of a total current, the electronic circuit comprising:

a power transistor arrangement to which the total current is applied, the power transistor arrangement including at least two parallel-connected partial power transistors, each of the at least two parallel-connected partial power transistors receiving a corresponding partial current of the total current; and at least two temperature-dependent controlling elements, each being coupled to a control input of a corresponding one of the at least two parallel-connected partial power transistors, and each being adapted for coupling with a control circuit for controlling the total current, wherein:

each of the at least two temperature-dependent controlling elements includes a temperature sensor for use in providing temperature-dependent regulation of each of the corresponding partial currents, each of the temperature sensors being thermally coupled with the corresponding one of the at least two parallel-connected partial power transistors so that each of the corresponding partial currents is based on a corresponding heat dissipation characteristic of the corresponding one of the at least two parallel-connected partial power transistors; and one of the corresponding partial currents based on the corresponding heat dissipation characteristic of the corresponding one of the at least two parallel-connected partial power transistors is greater than another corresponding partial current based on another corresponding heat dissipation characteristic of another corresponding one of the at least two parallel-connected partial power transistors if the corresponding heat dissipation characteristic is better than the another corresponding heat dissipation characteristic.

2. The electronic circuit according to claim 1, further comprising:

a control circuit the control circuit including a regulating circuit for maintaining the total current at a defined value.

3. The electronic circuit according to claim 1, wherein the at least two temperature-dependent control elements includes three temperature-dependent control elements.

4. The electronic circuit according to claim 2, further comprising:

a shunt coupled in series to the power transistor arrangement and further coupled to the regulating circuit via a voltage tap.

5. The electronic circuit according to claim 2, wherein the regulating circuit includes a first bipolar transistor and a second bipolar transistor, a base of the first bipolar transistor and a base of the second bipolar transistor being coupled to each other and to a collector of the first bipolar transistor, and a collector of the second bipolar transistor being coupled to the at least two temperature-dependent control elements.

6. The electronic circuit according to claim 5, wherein a shunt is coupled to a ground contact and an emitter of the first bipolar transistor, and wherein each of the at least two temperature-dependent control elements includes a two-stage bipolar common emitter circuit.

7. The electronic circuit according to claim 5, wherein a shunt is coupled to a ground contact and to an emitter of the second bipolar transistor, and wherein each of the at least two temperature-dependent control elements includes a single-stage common emitter circuit.

* * * * *

UNITED STATES PATENT AND TRADEMARK OFFICE
CERTIFICATE OF CORRECTION

PATENT NO.    : 6,191,645 B1
DATED         : February 20, 2001
INVENTOR(S)   : Georg Digele It is certified that error appears in the above-identified patent and that said Letters Patent is hereby corrected as shown below:

Column 7,
Line 31, delete "and";

Column 8,
Line 14, after "characteristic" insert -- and a control circuit responsive to the at least two temperature-dependent controlling elements, for controlling the power transistor arrangement to control the total current --;
Line 15, delete "further comprising" and insert -- wherein --; and
Line 17, delete "a control unit".

Signed and Sealed this

Twenty-second Day of October, 2002

Attest:

Attesting Officer

JAMES E. ROGAN
*Director of the United States Patent and Trademark Office*